US005781100A

United States Patent [19]

Komatsu

[11] Patent Number: 5,781,100

[45] Date of Patent: Jul. 14, 1998

[54] RESISTOR SUBSTRATE CONTAINING CARBON FIBERS AND HAVING A SMOOTH SURFACE

[75] Inventor: Hisasi Komatsu, Miyagi-ken, Japan

[73] Assignee: Alps Electric Co., Ltd., Tokyo, Japan

[21] Appl. No.: 838,790

[22] Filed: Apr. 9, 1997

Related U.S. Application Data

[63] Continuation of Ser. No. 400,170, Mar. 7, 1995.

[30] Foreign Application Priority Data

Mar. 16, 1994 [JP] Japan .................................... 6-046000

[51] Int. Cl.[6] .................................................. H01L 1/02

[52] U.S. Cl. ........................ 338/252; 338/160; 338/161; 338/311

[58] Field of Search ............................ 252/511; 338/160, 338/161, 252, 253, 255, 258, 262, 269, 275, 193, 306–311

[56] References Cited

U.S. PATENT DOCUMENTS

| | | | |
|---|---|---|---|
| 4,145,317 | 3/1979 | Sado et al. | 252/512 |
| 4,271,045 | 6/1981 | Steigerwald et al. | 252/511 |
| 4,350,741 | 9/1982 | Hasegawa et al. . | |
| 4,496,475 | 1/1985 | Abrams | 252/511 |
| 4,568,798 | 2/1986 | Ambros et al. | 252/511 |
| 4,722,765 | 2/1988 | Ambros et al. | 156/630 |
| 4,749,981 | 6/1988 | Yui et al. | 338/225 |
| 4,775,439 | 10/1988 | Seeger | 156/231 |
| 5,111,178 | 5/1992 | Bosze . | |
| 5,219,494 | 6/1993 | Ambros et al. | 252/511 |

FOREIGN PATENT DOCUMENTS

| | | | |
|---|---|---|---|
| 73904 | 3/1983 | European Pat. Off. . | |
| 259709 | 3/1988 | European Pat. Off. . | |
| 2489072 | 2/1982 | France . | |
| 738414 | 7/1943 | Germany . | |
| 4218938 | 12/1993 | Germany . | |
| 404018703A | 1/1992 | Japan | 338/160 |

OTHER PUBLICATIONS

EP 0259709 translation (Ambros et al.) prev. cited., Paper No. 4.

EP 0073904 translation (Ambros et al.) prev. cited., Paper No. 4.

German 4,218,938 translation (Kazmierczak) prev. cited., Paper No. 4.

*Primary Examiner*—Tu B. Hoang
*Assistant Examiner*—Karl Easthom
*Attorney, Agent, or Firm*—Guy W. Shoup

[57] ABSTRACT

A resistor substrate in which a resistor layer having an electroconductive powder and carbon fibers dispersed in a heat resistant resin is molded into a substrate comprising a heat resistant thermosetting molding material, and the surface of the resistor layer is in a mirror-finished state. The resistor substrate is manufactured by printing the resistor layer on a metal plate and heat-curing the same, molding the resistor layer formed on the metal plate in a die into a substrate shape with a heat resistant thermosetting resin and peeling the metal plate and transferring the resistor layer to the substrate molded from the heat resistant thermosetting resin.

4 Claims, 4 Drawing Sheets

[DATA FOR SURFACE ROUGHNESS]

CONCENTRATED OHMIC CONTACT $Rc_{max}$ IN SLIDING LIFE TEST FOR MINUTE DISTANCE

[DATA FOR SURFACE ROUGHNESS]

RESISTOR SUBSTRATE CONTAINING CARBON FIBERS AND HAVING A SMOOTH SURFACE

This application is a continuation of application Ser. No. 08/400,170, filed Mar. 7, 1995.

BACKGROUND OF THE INVENTION

1. Field of the Invention

The present invention concerns a transfer type resistor substrate for use in a variable resistor, sensor for electric equipment positional sensor for industrial machines and variable resistor for general use, as well as a production process therefor.

2. Description of the Prior Art

In existent compositions of resistor inks used in resistor substrates for variable resistors, electroconductive carbon black and a solvent are mixed and dispersed in a binder comprising a thermosetting resin such as a phenol formaldehyde resin to obtain a resistor paste, and the resistor paste is formed as a resistor layer on an insulative substrate directly by means of screen printing or the like, dried and then cured to obtain a resistor for film type resistor equipment.

In the technique disclosed as another prior art, a resistor layer prepared by binding an electroconductive powder mainly comprising carbon or fine graphite powder with an aromatic polyimide resin is formed directly by way of a method such as screen printing on a substrate comprising a diallyl isophtharate resin containing at least 500 ppm of a poly-merization initiator such as hydroquinone or like other derivative, a polymerization initiator such as dicumyl peroxide and an inorganic filler and then heated and compression molded to integrate the resistor material with the substrate. This can provide a resistor both having heat resistance and long life.

However, among the prior art techniques described above, the former undergoes the effect of the carbon fibers to form unevenness of about 1 um to 3 um on the surface of the resistor as shown in FIG. 6.

If a metal contact brush is caused to slide on the resistor material, protruded portions of the unevenness are scraped to result in a wear-induced powder. Then, if the wear-induced powder is present between the metal contact brush and the resistor, it result in increased ohmic contact.

The resistor ink containing no carbon fibers can make the printed surface smooth by using a fine mesh for screen printing but it involves a problem that the resistor layer tends to be scraped easily since no carbon fibers are contained. On the other hand, in the resistor ink containing the carbon fibers, it was difficult to make the printed surface smooth even by the use of a fine screen mesh.

Further, in the latter of the prior art techniques, it is impossible in view of the production process to render the glass transition point Tg of the resistor constituted with the aromatic polyimide resin higher than the thermoforming temperature (200° C.) of the diallyl isophtharate resin in the resistor substrate used for the resistor.

Further, in view of the sliding life of a contact sliding type variable resistor, the life tends to prolong as the glass transition point Tg of the resistor film is higher but the glass transition point Tg of the resistor film is limited by the moldable temperature of the substrate material in the above-mentioned method, so that the glass transition point Tg to be available for the aromatic polyimide resin can not be attained. Therefore, the life of the resistor layer can not be utilized its the maximum degree.

Further, since the resistor material after molding (aromatic polyimide) is in a so-called B stage, the resistance value may possibly vary greatly depending on the subsequent thermal hysteresis.

OBJECT AND SUMMARY OF THE INVENTION

A first object of the present invention is to provide a resistor substrate containing carbon fibers and having a smooth surface for a resistor layer.

A second object of the present invention is to provide a resistor substrate for which maximum glass transition point Tg is available both for the resistor layer and the substrate material, so that the life of the resistor layer can be utilized to the maximum, and the resistance value of the resistor layer does not change in thermal hysteresis after molding, as well as a manufacturing method therefor.

The first object of the present invention can be attained by a first aspect of the present invention in which the resistor layer having an electroconductive powder and carbon fibers dispersed in a heat resistant resin is molded to a substrate comprising a heat resistant thermo-setting molding material and the surface of the resistor layer is in a mirror finished state.

A second object of the present invention can be attained by a second feature of the present invention in which a resistor layer having an electroconductive powder and carbon fibers are dispersed in a polyimide resin is molded to a thermosetting resin comprising an epoxy resin.

The second object of the present invention can be attained by a third aspect of the present invention, which comprises:

a step of printing a resistor layer having an electroconductive powder and carbon fibers dispersed in a heat resistant resin on a metal plate and curing the same under heating, a step of molding and embedding the resistor layer molded on the metal plate into a substrate shape with a heat resistant thermosetting resin in a die, and a step of peeling the metal plate and transferring the resistor layer to the substrate molded with the heat resistant thermosetting resin.

The second object of the present invention can be attained by a fourth means in which an electroconductive powder dispersed in a heat resistant resin having a glass transition point of 300° C. or higher is molded to a substrate comprising a heat setting resin.

In the first aspect, since the resistor substrate is formed by molding and transferring the resistor layer previously formed on a mirror-finished metal plate, it has very smooth surface at a roughness of 0.1 μm to 0.5 μm and since it contains the carbon fibers, it is scraped.

Further, since less wear-induced powder is formed, no wear-induced powder is present between a metal contact brush and the resistor material to make the ohmic contact reduced and stable.

In the second to fourth aspects, both the glass transition point Tg of the resistor layer and the glass transition point Tg of the substrate material can be utilized to the maximum and the life of the resistor layer can be maximized.

Further, the resistance value of the resistor layer shows no change in thermal hysteresis after molding.

DESCRIPTION OF THE PREFERRED EMBODIMENTS

Figure 1:
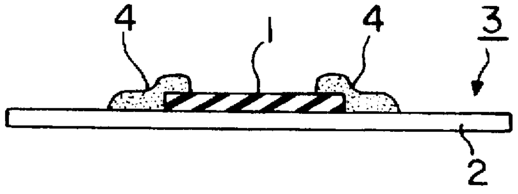
FIG. 1 is an explanatory view illustrating a production step of a primary substrate in a second embodiment according to the present invention.

A first embodiment according to the present invention will explained at first.

A resistor for a film resistor equipment in the first embodiment has a mirror finished surface for a substrate and a resistor layer, which is prepared by forming a resistor ink comprising at least carbon fiber and carbon black dispersed in a heat resistant resin into a predetermined shape on a mirror-finished metal plate, completely dried and cured and then transferred upon molding of a heat resistant thermosetting molding material.

The thermosetting resin usable herein can include phenol formaldehyde resin, xylene modified phenol resin, epoxy resin, polyimide resin, melamine resin, acrylic resin, acrylate resin, and furfuryl alcohol, and any kind of resins can be used with no particular restriction providing that they can be formulated as a varnish. Among the resins mentioned above, the polyimide resin can be said to be a particularly effective material in view of the sliding life since it has been confirmed that the resin can withstand heat generation upon sliding movement.

As the carbon black, acetylene black, furnace black, channel black or the like can be used, among which acetylene black can be said to be a particularly effective material since the structure is developed and has some reinforcing effect by itself, and shows less aging change for the resistance value.

As the graphite, flaky or slurry graphite can be used. Graphite is used with an aim of reducing the resistance value of the resistor material which may be partially or entirely replaced with carbon fiber. Since presence of graphite in the resistor paste has an effect capable of preventing the change of the resistance value with lapse of time due to kneading between a screen and a squeeze upon printing of the resistor ink, it is desirable to mix an appropriate amount of graphite.

As the carbon fiber, short fiber such as mild carbon fiber or chopped carbon fiber having 5 to 40 μm diameter and 5 to 100 μm length can be used, carbon fiber having 10 to 20 μm diameter and 10 to 50 μm length being particularly preferred. If the diameter and the length of the carbon fiber are smaller than the range described above, since the area of contact with the heat setting resin in the resistor coating layer is reduced to weaken the binding force, the carbon fiber tends to be scraped easily by the sliding movement of a slider, failing to attain a sufficient improvement for the sliding life. On the other hand, if the diameter or the length of the carbon fiber is greater than the above-mentioned range, the carbon fiber can not easily pass through the mesh of the screen used for printing to remarkably deteriorate the printability and some disturbance is caused to the characteristic of the resistance value change, which is not preferred.

As the solvent, one or more of glycolic, esteric or etheric type solvents may be used selectively so long as the solvent can dissolve the thermosetting resin described above.

In the present invention, the materials described above are properly weighed in accordance with the required resistance value and then they are kneaded in a dispersion/mixing device such as a ball mill or three roll mill, to produce a resistor ink.

The thus produced resistor ink is formed into a predetermined shape on a mirror-finished surface of a metal plate by means of a known screen printing process, completely dried and cured and then transferred upon molding a heat resistant thermosetting resin molding material, to provide a resistor substrate having a mirror finished surface for the substrate and the resistor layer.

The resistor layer is formed into a horseshoe-like or elongate shape. In the former, a slider is rotatably mounted to the substrate and, in the latter, the slider is mounted slidably relative to the substrate, to obtain a rotary or sliding type variable resistor.

As the slider, a material made of a noble metal capable of keeping a good contact with a resistor even in a long time sliding is used, specifically, nickel silver, plated at the surface with gold or silver, or an alloy of palladium, silver, platinum or nickel. Particularly, if there is a worry of surface oxidation at high temperature, a use of a noble metal alloy is desirable for keeping a stable contact state.

An example of the resistor ink is shown below.

EXAMPLE 1

| | |
|---|---|
| Polyimide resin | 100 pbw |
| Carbon black (acetylene black) | 41.7 pbw |
| Middle carbon fiber (7 μm dia. 30 μm length) | 31.9 bpw |
| Methyl triglym | 130 pbw |

Each of the ingredients described above was blended and mixed and dispersed by a three roll mill to produce a resistor ink.

Description will be made to a second embodiment according to the present invention.

Figure 2:
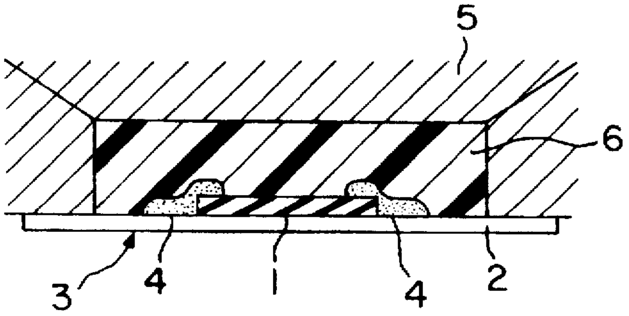
FIG. 2 is an explanatory view illustrating a production step of thermoforming in a second embodiment according to the present invention.
Figure 3:
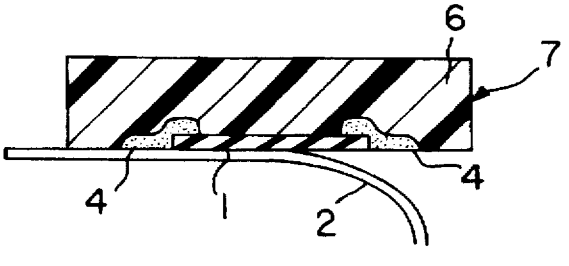
FIG. 3 is an explanatory view illustrating a production step of peeling a brass strip in a second embodiment according to the present invention.
Figure 4:
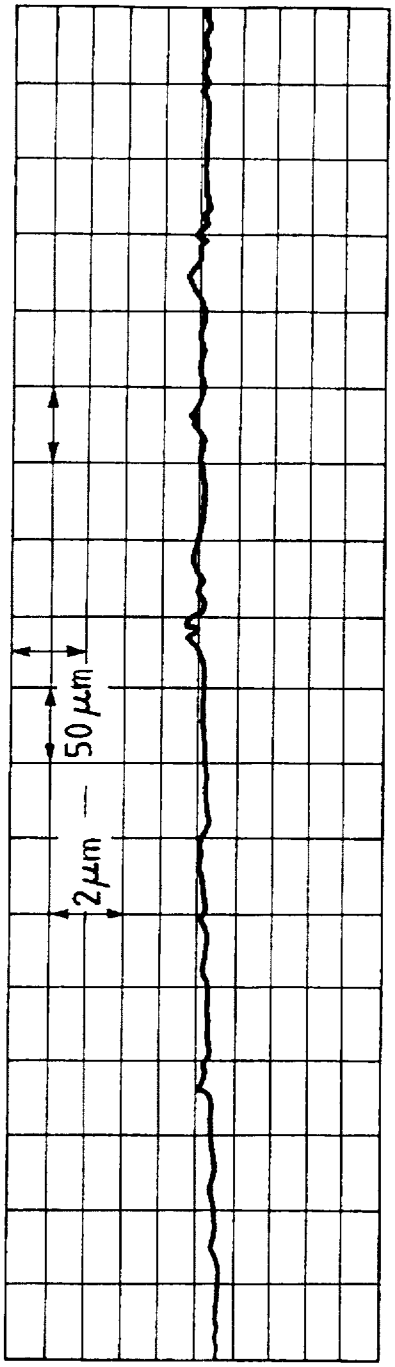
FIG. 4 is a explanatory view illustrating a data for surface roughness in the embodiment according to the present invention.
Figure 5:
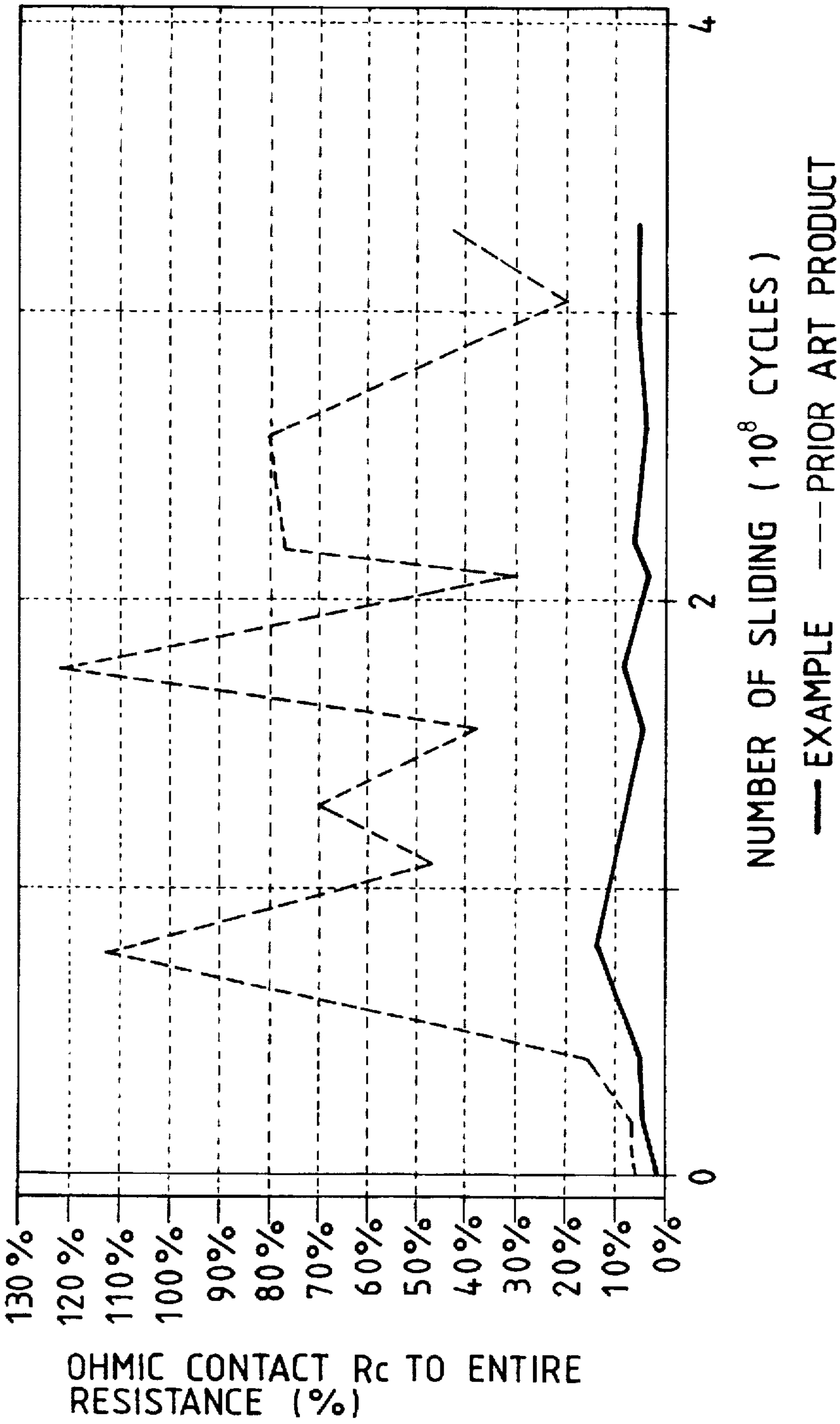
FIG. 5 is an explanatory view showing concentrated ohmic value $Rc_{max}$ in a minute distance sliding life test of the embodiment according to the present invention in comparison with that of the prior art.

FIG. 1 to FIG. 3 show respective production steps for the second embodiment according to the present invention wherein FIG. 1 is an explanatory view illustrating a production step of a primary substrate in the second embodiment according to the present invention, FIG. 2 is an explanatory view illustrating a production step of thermosetting in the second embodiment according to the present invention, FIG. 3 is an explanatory view illustrating a production step of peeling a brass strip in the second embodiment according to the present invention, FIG. 4 is a explanatory view illustrating a data for surface roughness in the embodiment according to the present invention, and FIG. 5 is an explanatory view showing concentrated ohmic value $Rc_{max}$ in a minute distance sliding life test of the embodiment according to the present invention in comparison with that of the prior art.

Production process for the second embodiment will be explained with reference to FIG. 1 to FIG. 3.

As shown in FIG. 1, after forming a resistor layer 1 comprising a electroconductive powder such as carbon and electroconductive carbon fibers dispersed in a terminal acetylenized polyisoimide oligomer on a mirror-finished metal plate 2 made of brass strip, aluminum or steel as a primary substrate, it was cured by heating at 350° C. to 380° C. for 2 to 3 hours to obtain a primary substrate 3. The glass transition point Tg is higher than 300° C. In the drawings, reference numeral 4 denotes a conductor comprising polyimide resin, Ag, etc.

As shown in FIG. 2, the resistor layer 1 on the primary substrate 3 is molded into a shape of a substrate in a die 5 with a highly heat resistant thermosetting resin such as a cresol novolac type epoxy resin as a secondary substrate.

When the molding product is taken out of the die 5 and the primary substrate 3 is peeled, the resistor layer 1 previously formed on the primary substrate 3 is transferred to and integrated with a secondary substrate (insulation portion) 6 formed from thermosetting resin as shown in FIG. 3 to obtain a resistor substrate 7 having a mirror-finished surface.

FIG. 4 is an explanatory view illustrating the data for the surface roughness in the embodiment according to the present invention.

Figure 6:
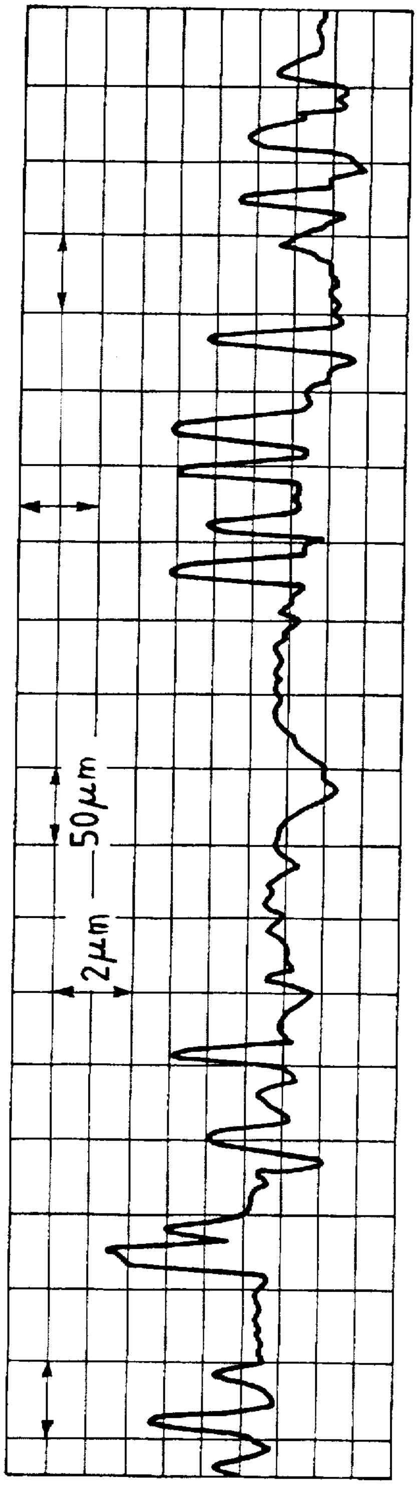
FIG. 6 PRIOR ART
FIG. 6 is an explanatory view illustrating the data for surface roughness in the prior art.

As apparent from FIG. 4, the resistor substrate according to the present invention is finished extremely smooth at a surface roughness of 0.1 μm to 0.5 μm. On the contrary, in the prior art product described above, unevenness of about 1 μm to 3 μm is formed as shown in FIG. 6.

FIG. 5 is an explanatory view illustrating a concentrated ohmic resistance $Rc_{max}$ in a minute distance sliding life test of the embodiment according to the present invention in comparison with the prior art product.

When the minute distance sliding life test is conducted for the resistor substrate according to the present invention, as can be seen from the data for the value of the concentrated ohmic resistance $Rc_{max}$ in the minute distance sliding life test, Rc% shows scarce change as about 10% relative to the cycles of sliding movement in the product of this embodiment (shown by a solid line), whereas it changes greatly in the prior art product (shown by a dotted line). The life of the product of this embodiment was more than three hundred million of cycles compared to about one hundred million of cycles of the life for the prior art product. In the graph, the abscissa means the number of sliding movement (unit: $10^8$ cycles), while the ordinate represent Rc (ohmic contact) % relative to the entire resistance value.

In the first embodiment, since the resistor substrate has the resistor layer formed on a mirror-finished metal plate and then molded and transferred, the surface roughness is extremely smooth as 0.1 μm to 0.5 μm. Further, since it contains the carbon fiber, an effect of suppressing scraping can be obtained as shown by the data in FIG. 4.

Further, since less wear-induced powder is formed, no wear-induced powder is present between a metal contact brush and the resistor material to obtain an effect that the ohmic contact is low and stable.

In the second embodiment, both the glass transition point Tg of the resistor material 1 and the glass transition point Tg of the substrate material are available to maximum and the life of the resistor layer 1 can be maximized.

Further, since the resistor layer is completely cured, the resistance value does not change in the subsequent thermal hysteresis.

What is claimed is:

1. A variable resistor for use in a potentiometer having a movable wiper, the resistor comprising:

a wiper an insulation substrate formed from heat resistant thermosetting molding material; and a resistor layer molded and imbedded in said insulation substrate and positioned such that it has a surface contacted by the movable wiper, said resistor layer having an electroconductive powder and carbon fibers dispersed in a heat resistant resin;

wherein said surface of the resistor layer contoured by the movable wiper has a surface roughness foremost of said surface which is less than or equal to 0.5 μm; and wherein said carbon fibers have a length in the range of 21–100 μm, a diameter in the range of 5–40 μm, and a length to diameter ratio which is greater than or equal to 30:7.

2. The variable resistor according to claim 1, wherein the heat resistant resin in the resistor layer has a glass transition point of 300° C. or higher.

3. A resistor variable comprising:

A movable wiper an insulation substrate formed from heat resistant thermosetting molding material; and a resistor layer molded and imbedded in said insulation substrate said resistor layer having an electroconductive powder and carbon fibers dispersed in a heat resistant resin and having an exposed surface for contact with said movable wiper, wherein, said exposed surface of the resistor layer has a surface roughness which is less than or equal to 0.5 μm over most of said exposed surface for contact with said movable wiper; and wherein said carbon fibers have a length in the range of 21–100 μm, a diameter in the range of 5–40 μm, and a length to diameter ratio which is greater than or equal to 30:7.

4. The variable resistor according to claim 3, wherein the heat resistant resin in the resistor layer has a glass transition point of 300° C. or higher.

* * * * *

UNITED STATES PATENT AND TRADEMARK OFFICE

CERTIFICATE OF CORRECTION

PATENT NO. : 5,781,100

DATED : July 14, 1998

INVENTOR(S) : Hisasi Komatsu

It is certified that error appears in the above-indentified patent and that said Letters Patent is hereby corrected as shown below:

<u>In the Title Page</u>

In column 2, line 6, under "FOREIGN PATENT DOCUMENTS" replace "404018703A" with --4-18703--.

In Claim 1, line 11, replace "contoured" with --contacted--.

In Claim 1, line 12, replace "foremost" with --over most--.

In Claim 3, line 1, change "A resistor variable" to --A variable resistor--.

In Claim 3, line 2, change "A" to --a--.

Signed and Sealed this

Thirty-first Day of August, 1999

*Attest:*

Q. TODD DICKINSON

*Attesting Officer*

*Acting Commissioner of Patents and Trademarks*